(12) United States Patent
Herring et al.

(10) Patent No.: US 8,864,516 B2
(45) Date of Patent: Oct. 21, 2014

(54) CABLE ASSEMBLY FOR INTERCONNECTING CARD MODULES IN A COMMUNICATION SYSTEM

(75) Inventors: Michael David Herring, Apex, NC (US); Arash Behziz, Newbury Park, CA (US)

(73) Assignee: Tyco Electronics Corporation, Berwyn, PA (US)

( * ) Notice: Subject to any disclaimer, the term of this patent is extended or adjusted under 35 U.S.C. 154(b) by 209 days.

(21) Appl. No.: 13/404,917

(22) Filed: Feb. 24, 2012

(65) Prior Publication Data

US 2013/0223036 A1    Aug. 29, 2013

(51) Int. Cl.
*H01R 11/00*    (2006.01)
*H05K 7/00*    (2006.01)

(52) U.S. Cl.
USPC ............................. 439/502; 361/729

(58) Field of Classification Search
None
See application file for complete search history.

(56) References Cited

U.S. PATENT DOCUMENTS

| | | | | |
|---|---|---|---|---|
| 4,420,794 A * | 12/1983 | Anderson | ...... | 361/809 |
| 4,954,100 A * | 9/1990 | McCleerey | ...... | 439/492 |
| 5,227,957 A * | 7/1993 | Deters | ...... | 361/679.32 |
| 5,515,515 A * | 5/1996 | Kennedy et al. | ...... | 710/302 |
| 5,518,418 A * | 5/1996 | Larabell | ...... | 439/505 |
| 5,540,597 A * | 7/1996 | Budman et al. | ...... | 439/77 |
| RE36,845 E * | 8/2000 | Huppenthal et al. | ...... | 439/638 |
| 6,118,554 A * | 9/2000 | Horaguchi | ...... | 358/474 |
| 6,447,339 B1 * | 9/2002 | Reed et al. | ...... | 439/638 |
| 6,498,890 B1 * | 12/2002 | Kimminau | ...... | 385/134 |
| 6,500,025 B1 * | 12/2002 | Moenkhaus et al. | ...... | 439/502 |
| 6,719,591 B1 * | 4/2004 | Chang | ...... | 439/638 |
| 6,728,108 B2 * | 4/2004 | Chen | ...... | 361/736 |
| 6,743,054 B2 * | 6/2004 | Wu | ...... | 439/638 |
| 6,754,087 B1 | 6/2004 | Lee et al. | | |
| 6,907,615 B1 * | 6/2005 | Alexander et al. | ...... | 725/80 |
| 7,108,556 B2 | 9/2006 | Cohen et al. | | |
| 7,134,908 B2 * | 11/2006 | Wu | ...... | 439/502 |
| 7,331,802 B2 | 2/2008 | Rothermel et al. | | |
| 7,354,305 B2 * | 4/2008 | Sundstrom | ...... | 439/505 |
| 7,515,427 B2 * | 4/2009 | King et al. | ...... | 361/725 |
| 7,621,781 B2 | 11/2009 | Rothermel et al. | | |
| 7,758,385 B2 | 7/2010 | Davis et al. | | |
| 7,946,883 B2 * | 5/2011 | Hayes et al. | ...... | 439/502 |
| 8,014,165 B2 * | 9/2011 | Hamner et al. | ...... | 361/785 |
| 2002/0046878 A1 | 4/2002 | Uzuka et al. | | |

(Continued)

OTHER PUBLICATIONS

High Speed Backplane Quick Reference Guide, Aug. 20011 (6 pages).

(Continued)

*Primary Examiner* — Hoa C Nguyen
*Assistant Examiner* — Xanthia C Cunningham

(57) ABSTRACT

A cable assembly including first and second header connectors. The first header connector has mating and loading sides and includes electrical contacts. The mating side is configured to mate with a first module connector. The second header connector has mating and loading sides and includes electrical contacts. The mating side of the second header connector is configured to mate with a second module connector. The cable assembly also has a cable bundle including communication cables that extend between the loading sides of the first and second header connectors and that connect the electrical contacts of the first and second header connectors. The cables are substantially twist-free between the first and second header connectors when the first and second header connectors face in substantially opposite directions and the first and second module connectors have an orthogonal relationship.

20 Claims, 7 Drawing Sheets

(56) References Cited

U.S. PATENT DOCUMENTS

| | | |
|---|---|---|
| 2003/0032333 A1* | 2/2003 | Kwong .................. 439/638 |
| 2005/0207134 A1 | 9/2005 | Belady et al. |
| 2006/0276083 A1* | 12/2006 | Sun ..................... 439/638 |
| 2007/0021001 A1* | 1/2007 | Laurx et al. ............. 439/608 |
| 2007/0230152 A1* | 10/2007 | Abe ..................... 361/796 |
| 2008/0045079 A1* | 2/2008 | Minich et al. ........... 439/544 |
| 2009/0027867 A1* | 1/2009 | Yamamoto et al. ........ 361/785 |
| 2009/0174991 A1* | 7/2009 | Mahdavi ............... 361/679.02 |
| 2010/0291794 A1* | 11/2010 | Luo et al. .............. 439/502 |
| 2012/0122335 A1* | 5/2012 | Costello ............... 439/502 |

OTHER PUBLICATIONS

Strada Whisper Connector System, Nov. 4, 2010, (16 pages).
ZPack Tinman, Aug. 24, 2010, (38 pages).
International Search Report in related application No. PCT/US2013/024809 issued on Jul. 8, 2013.

* cited by examiner

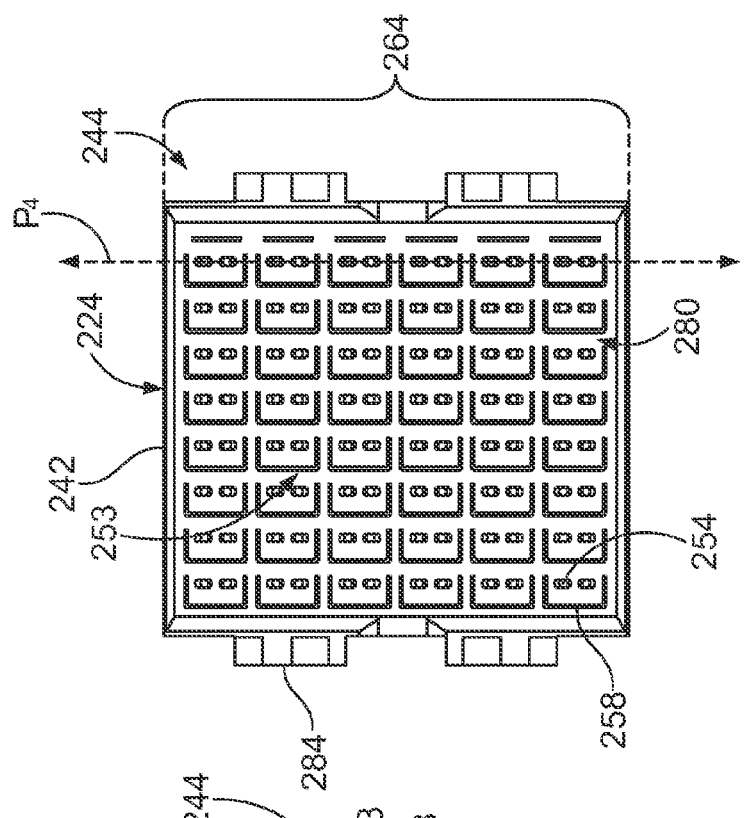
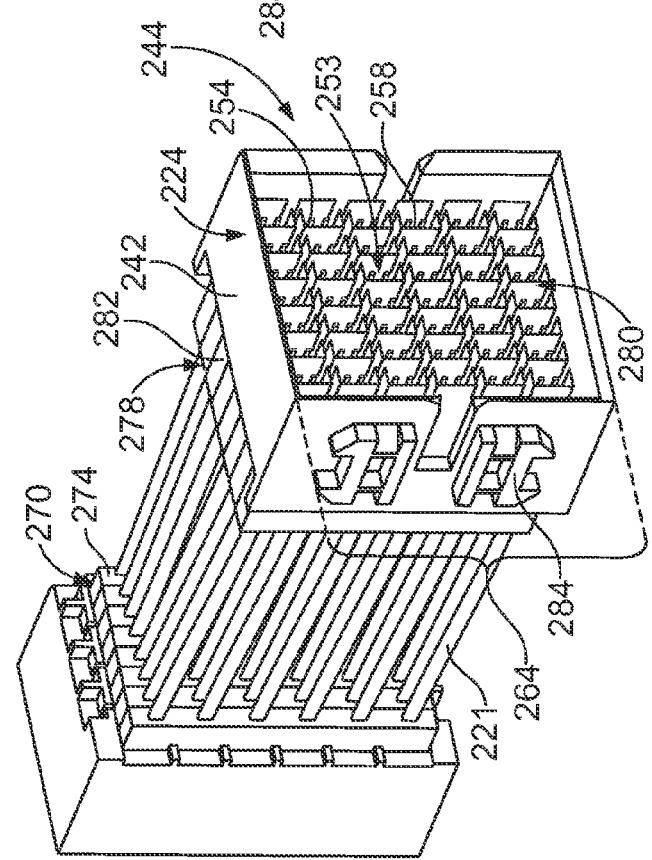

CABLE ASSEMBLY FOR INTERCONNECTING CARD MODULES IN A COMMUNICATION SYSTEM

BACKGROUND OF THE INVENTION

The subject matter described and/or illustrated herein relates generally to a cable assembly that is configured to interconnect card modules in a communication system.

Some communication systems, such as a blade server system, include a large backplane (or midplane) circuit board, which is generally referred to as a backplane (or midplane). The system also includes a plurality of card modules (e.g., line cards, server blade cards, switch cards, I/O cards). Some of the card modules may be coupled to a front side of the backplane, and other card modules can be coupled to a back side of the backplane. The card modules coupled to the front side extend parallel to each other, but orthogonal to the card modules coupled to the back side of the backplane. For example, the card modules along the front side may extend vertically, and the card modules along the back side may extend horizontally. The front side card modules and the back side card modules are communicatively coupled to one another through the backplane.

The front side and/or back side card modules typically include a card (e.g., a circuit board) with a number of mating connectors mounted to a leading edge of the card. The card modules are configured to be inserted into a system chassis where the mating connectors are coupled to electrical connectors of the backplane during a mating operation. However, as the number of mating connectors along the leading edge increases, it may become more challenging to align the mating connectors due to tolerances in the manufacturing of the cards, the mating connectors, the backplane, the system chassis, or other components of the system. Moreover, the large backplane may impede airflow throughout the communication system.

Accordingly, there is a need to improve the interconnection of card modules in a communication system.

BRIEF DESCRIPTION OF THE INVENTION

In one embodiment, a cable assembly is provided that includes a first header connector. The first header connector has mating and loading sides and includes electrical contacts. The mating side is configured to mate with a first module connector. The cable assembly also includes a second header connector that has mating and loading sides and includes electrical contacts. The mating side of the second header connector is configured to mate with a second module connector. The cable assembly also has a cable bundle including communication cables that extend between the loading sides of the first and second header connectors and that connect the electrical contacts of the first and second header connectors. The cables are substantially twist-free between the first and second header connectors when the first and second header connectors face in substantially opposite directions and the first and second module connectors have an orthogonal relationship.

In another embodiment, a cable assembly is provided that includes a first header connector having mating and loading sides and electrical contacts. The mating side is configured to mate with a first module connector. The cable assembly also includes a second header connector having mating and loading sides and electrical contacts. The mating side of the second header connector is configured to mate with a second module connector. The cable assembly also includes a cable bundle having communication cables that extend between the loading sides of the first and second header connectors and connect the electrical contacts of the first and second header connectors. The cables extend generally parallel to a line that extends between respective centers of the loading sides of the first and second header connectors. The cable bundle does not permit the first header connector to be twisted 90° about the line when the mating sides face in substantially opposite directions without damaging at least one of the cables, the first header connector, or the second header connector.

In a further embodiment, a communication system is provided that includes a system chassis and a front card module having a circuit board and a module connector mounted to the circuit board. The communication system also includes a rear card module having a circuit board and a module connector mounted to the circuit board. The front and rear card modules are held by the system chassis. The module connectors of the front and rear card modules substantially oppose each other with a gap therebetween. The communication system also includes a cable assembly that is positioned in the gap and includes first and second header connectors. The first header connector is mated to the module connector of the front card module and the second header connector is mated to the module connector of the rear card module. The cable assembly also includes a cable bundle having communication cables that extend between and connect the first and second header connectors. The cables extend across the gap in a substantially twist-free manner when the first and second header connectors are mated to the corresponding module connectors and the circuit boards of the front and rear card modules have an orthogonal relationship relative to each other.

Optionally, the first header connector can include contact modules that have the electrical contacts of the first header connector. The electrical contacts of each contact module can extend within a single module plane. Optionally, the second header connector can include contact modules that have the electrical contacts of the second header connector. The electrical contacts of each contact module of the second header connector can extend within a single module plane. In some embodiments, the module planes of the first header connector and the module planes of the second header connector can extend substantially parallel to one another when the first and second module connectors have an orthogonal relationship.

BRIEF DESCRIPTION OF THE DRAWINGS

FIG. 6 is a rear perspective view of the cable assembly of FIG. 3.

FIG. 7 is a rear end view of the cable assembly of FIG. 3 illustrating a different mating interface.

DETAILED DESCRIPTION OF THE INVENTION

Figure 1:
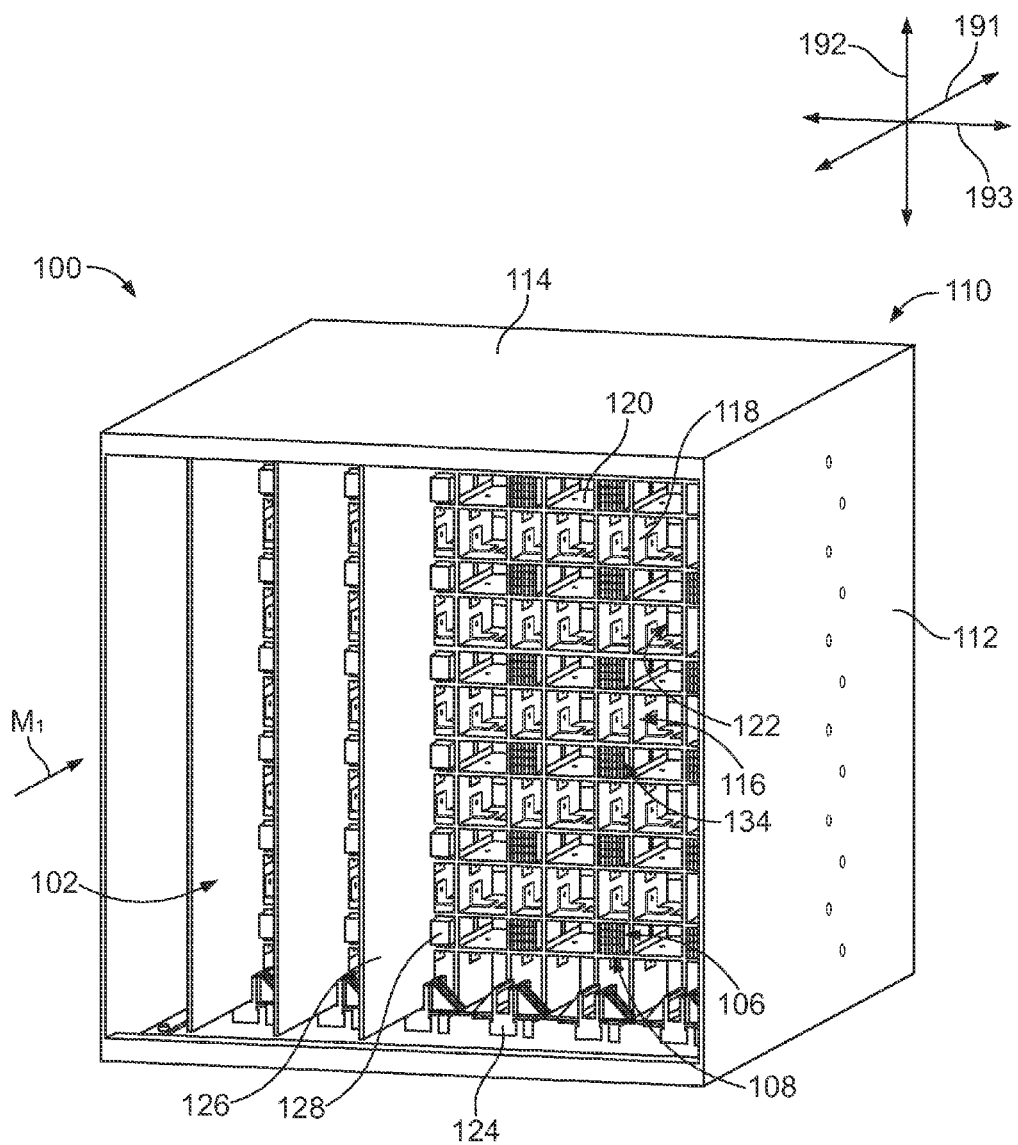
FIG. 1 is a front perspective view of a communication system formed in accordance with one embodiment.

FIG. 1 is a front perspective view of a communication system 100 formed in accordance with an exemplary embodiment. As shown, the communication system 100 is oriented with respect to mutually perpendicular axes 191-193 that include a mating axis 191, an orientation (or vertical) axis 192, and a lateral (or horizontal) axis 193. In an exemplary embodiment, the communication system 100 interconnects a plurality of front card modules 102 with a plurality of rear card modules 104 (shown in FIG. 2) using cable assemblies 106. In the illustrated embodiment, the communication system 100 is a blade server system in which the front card modules 102 are removable line cards or server blade cards and the rear card modules 104 are removable switch cards or I/O cards. However, a blade server system is only one example and embodiments described may be used in other types of communication environments. For example, the cable assemblies 106, which are described in greater detail below, may be used to interconnect other types of card modules or may be used to interconnect electrical connectors that are not part of card modules.

The communication system 100 may be arranged in different configurations to hold the front card modules 102 and the rear card modules 104. For example, in the illustrated embodiment, the front card modules 102 are oriented vertically and the rear card modules 104 are oriented horizontally. When the communication system 100 is set up in such a configuration, the communication system 100 defines an orthogonal communication system. Each of the front card modules 102 may be communicatively coupled to a plurality of rear card modules 104, and each of the rear card modules 104 may be communicatively coupled to a plurality of front card modules 102. Alternatively, the front and rear card modules 102, 104 may have the same orientation (i.e., the front and rear card modules 102, 104 could both be oriented horizontally or could both be oriented vertically). In such configurations, the communication system 100 defines a coplanar communication system. In the coplanar configuration, each front card module 102 can be communicatively coupled to a single rear card module 104.

The communication system 100 includes a system chassis 110 for holding the front card modules 102 and the rear card modules 104. The system chassis 110 includes a cabinet 112 having a plurality of walls 114 that define the cabinet 112. The front card modules 102 are configured to be inserted into the cabinet 112 along the mating axis 191 in a mating direction $M_1$. The rear card modules 104 are configured to be inserted into the cabinet 112 in the opposite direction.

As shown, the system chassis 110 includes a framework 116 of interconnected panels 118, 120 that are arranged within the cabinet 112. The framework 116 may be coupled to the walls 114 to hold the framework 116 within the cabinet 112. The panels include vertical panels 118 and horizontal panels 120 that are arranged in a matrix to define a plurality of assembly cells 122. The cable assemblies 106 are received within corresponding assembly cells 122. Also shown, a plurality of holders or card guides 124 are arranged within the cabinet 112 to hold the front card modules 102.

Each front card module 102 includes a circuit board 126 having a plurality of module connectors 128 mounted to a leading edge of the circuit board 126. The front card module 102 is configured to be advanced in the mating direction $M_1$ to load the front card module 102 into the cabinet 112. The front card module 102 is guided into position by the holders 124. In the illustrated embodiment, the front card module 102 is loaded into the cabinet 112 in a vertical orientation. However, as described above, the front card module 102 may be loaded into the cabinet 112 in a horizontal orientation rather than a vertical orientation.

The front card module 102 is loaded into the cabinet 112 such that the module connectors 128 mate with corresponding header connectors 108 of the cable assembly 106. In an exemplary embodiment, the header connectors 108 are allowed to float in one or more directions within the assembly cells 122 to align the header connectors 108 with the module connectors 128. For example, the header connectors 108 may float in any direction that is transverse to the mating axis 191. The header connectors 108 within the same column may be moved in different directions with respect to one another to align with the module connectors 128 of a particular front card module 102. The header connectors 108 within a particular row may be moved in different directions with respect to one another to align with the module connectors 128 of different front card modules 102.

Figure 2:
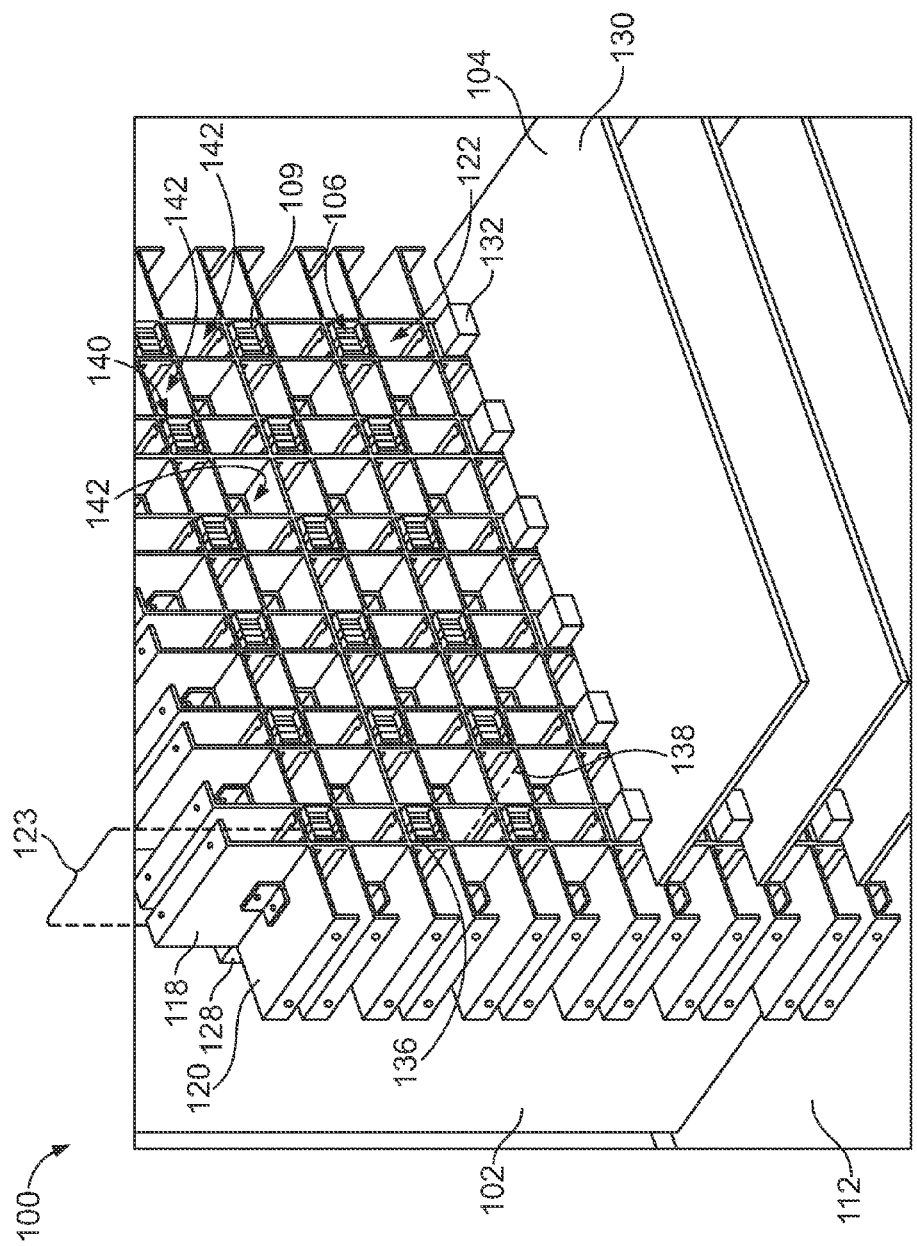
FIG. 2 is a rear perspective view of a portion of the communication system of FIG. 1 with a portion of a cabinet removed for illustrative purposes.

FIG. 2 is a rear perspective view of the communication system 100 with a portion of the cabinet 112 removed for illustrative purposes. FIG. 2 shows three of the rear card modules 104 mated with the corresponding cable assemblies 106. With the rear card modules 104 oriented perpendicularly with respect to the front card modules 102, the communication system 100 defines an orthogonal communication system. The rear card modules 104 each include a circuit board 130 and a plurality of module connectors 132 mounted to a leading edge of the circuit board 130. The rear card modules 104 are loaded into the cabinet 112 such that the module connectors 132 mate with corresponding header connectors 109 of the cable assemblies 106. The header connectors 109 are able to float within the assembly cells 122 so that the header connectors 109 may be aligned with the module connectors 132 during a mating operation.

In an exemplary embodiment, the assembly cells 122 extend between a first opening 134 (shown in FIG. 1) and a second opening 136. Each assembly cell 122 includes a gap or cavity 123 that extends between the first and second openings 134, 136. The gap 123 exists between the module connector 128 and the module connector 132 when the front and rear card modules 102, 104 are loaded into the communication system 100. The assembly cells 122 have cell axes 138 extending between the first and second openings 134, 136. The cell axes 138 may extend parallel to the mating axis 191 (FIG. 1).

The vertical and horizontal panels 118, 120 are oriented generally perpendicular with respect to one another such that the assembly cells 122 have rectangular cross-sections along the cell axes 138. Optionally, the assembly cells 122 may have different sizes and shaped cross-sections. In some embodiments, a first subset of the assembly cells 122 defines connector cells 140 that are configured to receive the cable assemblies 106. Another subset of the assembly cells 122 define airflow cells 142 extending between the first and second openings 134, 136.

Figure 3:
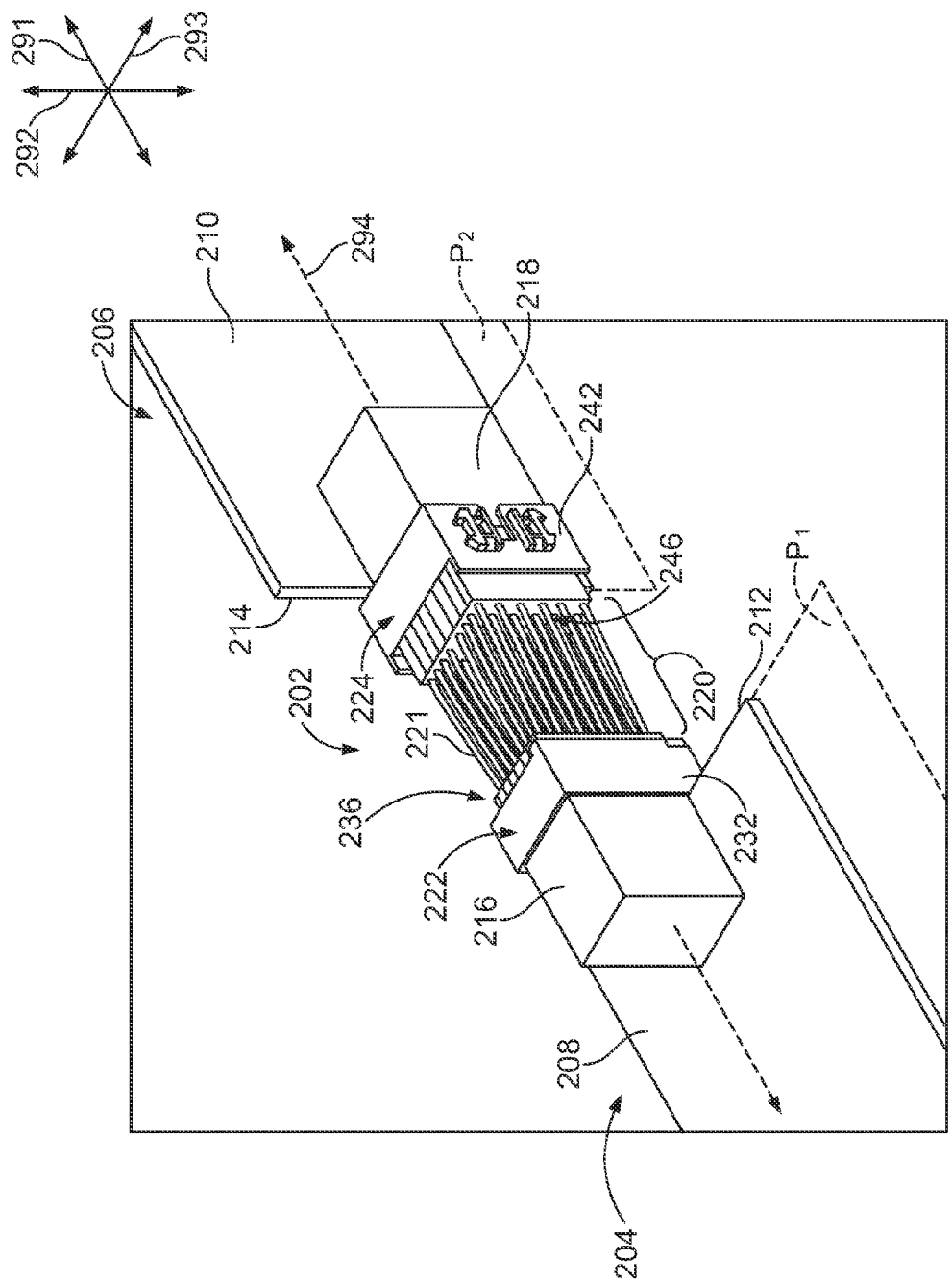
FIG. 3 is a perspective view of two card modules interconnected by a cable assembly formed in accordance with one embodiment.

FIG. 3 is a perspective view of a cable assembly 202 formed in accordance with one embodiment that is interconnecting a first (or front) card module 204 and a second (or rear) card module 206. The cable assembly 202 may be similar to the cable assembly 106 (FIG. 1) and used in the communication system 100 (FIG. 1). However, for illustrative purposes, the cable assembly 202 and the first and second card modules 204, 206 are shown without the system chassis 110 (FIG. 1). Nonetheless, when the cable assembly 202 is positioned within the communication system 100, the cable assembly 202 can be held within a corresponding assembly cell 122 (FIG. 1) and positioned within the gap 123 (FIG. 2). The first and second card modules 204, 206 may be held by the cabinet 112 (FIG. 1) while mated with the cable assembly 202. The cable assembly 202 can extend across the gap 123 to interconnect the first and second card modules 204, 206.

As shown, the first and second card modules 204, 206 include respective circuit boards 208, 210 having leading edges 212, 214, respectively. The first and second card modules 204, 206 also include respective module connectors 216, 218 that are mounted proximate to the leading edges 212, 214. The circuit boards 208, 210 extend along respective board planes $P_1$, $P_2$. As shown, the board planes $P_1$, $P_2$ are orthogonal to each other. The board plane $P_1$ extends parallel to the mating and lateral axes 291, 293, and the board plane $P_2$ extends parallel to the mating and orientation axes 291, 292. The axes 291-293 are mutually perpendicular to one another and may coincide with the axes 191-193, respectively, shown in FIG. 1.

In an exemplary embodiment, the cable assembly 202 includes first and second header connectors 222, 224 and a cable bundle 220 that extends therebetween. The header connector 222 can be similar to the header connector 108 (FIG. 1), and the header connector 224 can be similar to the header connector 109 (FIG. 1). The header connector 222 is configured to be positioned within the first opening 134 (FIG. 1), and the header connector 224 is configured to be positioned within the second opening 136 (FIG. 2).

The header connector 222 includes a connector housing 232 and has a mating side 234 (shown in FIG. 4) and a loading side 236, and the header connector 224 includes a connector housing 242 and has a mating side 244 (shown in FIG. 6) and a loading side 246. In an exemplary embodiment, when the cable assembly 202 interconnects the first and second card modules 204, 206, the loading sides 236, 246 substantially oppose each other and the mating sides 234, 244 face in substantially opposite directions along the mating axis 291. The cable assembly 202 may be aligned along an axial line 294 that extends through the header connectors 222, 224. The axial line 294 may extend through centers of the loading sides 236, 246, respectively, and generally parallel to the mating axis 291.

The cable bundle 220 includes communication cables 221 that extend proximate to one another in the cable bundle 220. The cable bundle 220 extends between the loading sides 236, 246 and communicatively couples the header connectors 222, 224. The cables 221 are terminated to the loading side 236 of the header connector 222 and to the loading side 246 of the header connector 224. In particular embodiments, the cables 221 are relatively short, such as less than about twice a length of the header connector 222 or twice a length of the header connector 224 measured along the mating axis 291. By way of example only, the cables 221 may be less than about 4 cm or about 3 cm or, more particularly, less than about 2 cm. In an exemplary embodiment, the cables 221 constitute twisted pair cables that include two conductors that are twisted about a center drain wire. However, the cables 221 may be other types. For example, the cable 221 may be a twin-axial cable including two conductors that extend parallel to each other and have a drain wire extending therebetween. This type of cable may also be described as a parallel pair with a center drain. As another example, the cable 221 may include a parallel pair of conductors and one or more drain wires that do not extend between the parallel conductors.

In an exemplary embodiment, the header connectors 222, 224 are different types of connectors. For example, the header connector 222 may be a cable mounted version of Z-PACK Tinman® connectors, commercially available from Tyco Electronics, and the header connector 224 may be a cable-mounted version of STRADA Whisper® connectors, commercially available from Tyco Electronics. However, these are non-limiting examples and the header connectors 222, 224 may be other types of connectors in alternative embodiments. In other embodiments, the header connectors 222, 224 may also be of the same type. The header connectors 222, 224 can be identical.

As shown, the header connectors 222, 224 face in opposite directions along the mating axis 291. The header connectors 222, 224 are rotatably offset with respect to each another. More specifically, the header connector 224 is rotated about 90° on the mating axis 291 with respect to the header connector 222. However, as shown, each of the cables 221 is not twisted and follows a generally straight path from one termination point at the header connector 222 to another termination point at the header connector 224.

Figure 5:
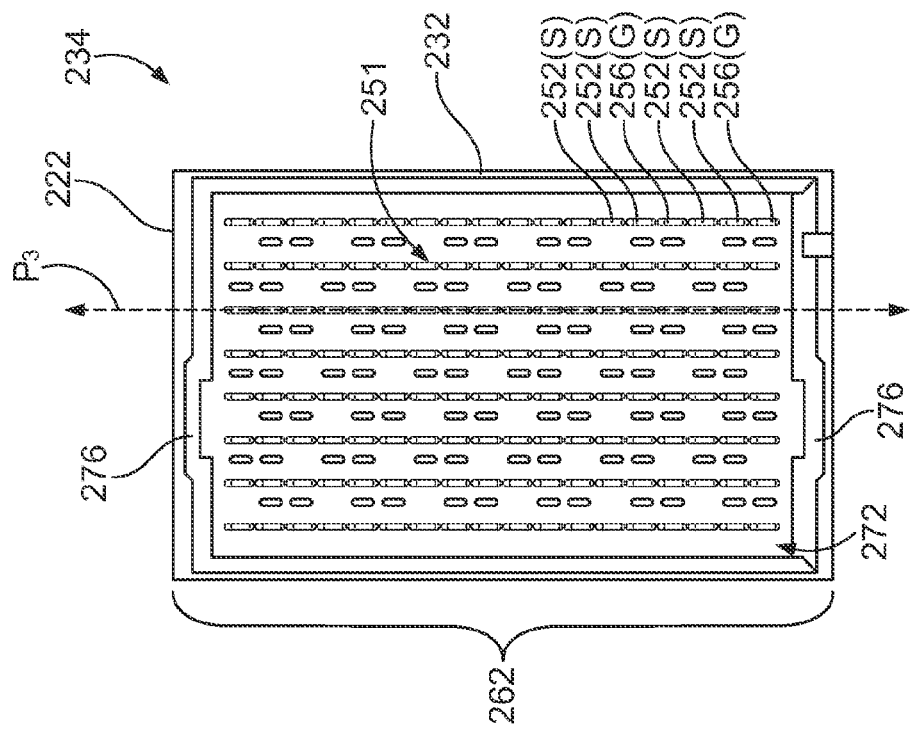
FIG. 5 is a front end view of the cable assembly of FIG. 3 illustrating a mating interface.
Figure 4:
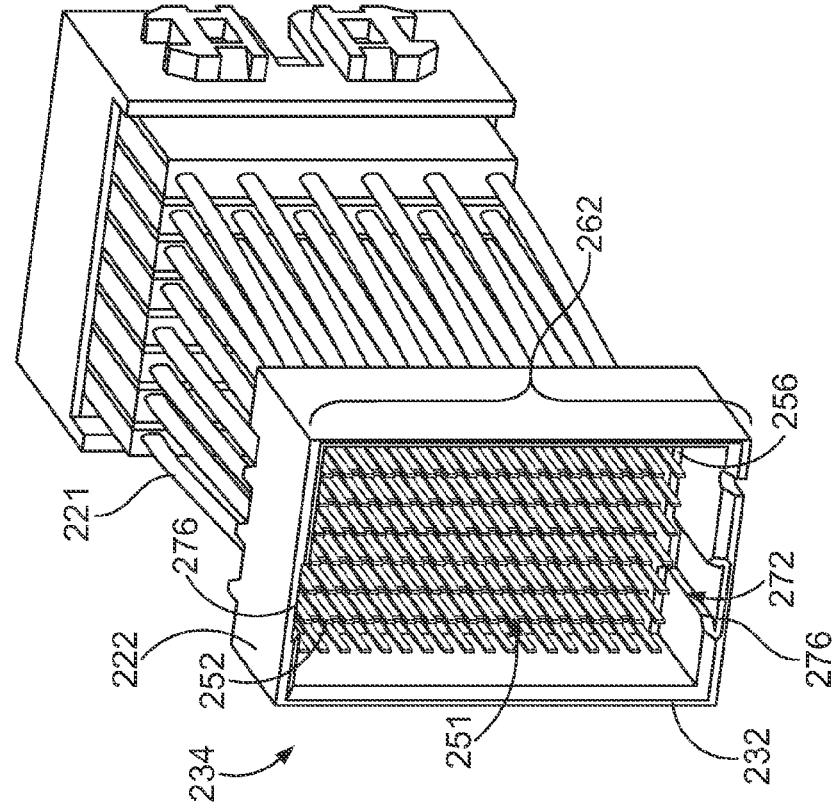
FIG. 4 is a front perspective view of the cable assembly of FIG. 3.

FIGS. 4 and 5 illustrate the mating side 234 of the header connector 222, and FIGS. 6 and 7 illustrate the mating side 244 of the header connector 224. The header connector 222 includes an array 251 of electrical contacts including signal contacts 252 (FIG. 4), and the header connector 224 includes an array 253 of electrical contacts including signal contacts 254 (FIG. 6). The signal contacts 252, 254 are configured to transmit data signals therethrough.

In some embodiments, the header connectors 222, 224 are not identical and may have different mating interfaces 262 (FIG. 4) and 264 (FIG. 6), respectively. As used herein, a "mating interface" includes elements or features of a connector that directly engage another connector during a mating operation. Such features include signal contacts, ground contacts, and alignment features. Mating interfaces, such as the mating interfaces 262, 264 of the header connectors 222, 224, are different if (a) the size and/or shape of the signal and/or ground contacts of one mating interface are different from the size and/or shape of the signal and/or ground contacts of the other mating interface; (b) the arrangements of the signal and/or ground contacts are different; and/or (c) the alignment features of the mating interfaces are different. The mating interfaces may also be different if the mating interfaces have different dimensions (e.g., height, width). If one or more of the above are different, then the mating interfaces are different. Generally, header connectors that have different mating interfaces with respect to each other will mate with module connectors that have different mating interfaces with respect to each other.

With reference to the header connector 222 shown in FIGS. 4 and 5, the header connector 222 includes the connector housing 232 and a plurality of contact modules 270 (shown in FIG. 6). The contact modules 270 are held by the connector housing 232. Each contact module 270 includes a plurality of the signal contacts 252. The connector housing 232 includes a receiving space 272 along the mating side 234 that is configured to receive a portion of the module connector 216 (FIG. 3). The signal contacts 252 extend into the receiving space 272.

In an exemplary embodiment, the signal contacts 252 are arranged in pairs and are configured to carry differential pair signals. The signal contacts 252 within each differential pair are held within a common contact module 270. In some embodiments, the signal contacts 252 of each contact module 270 extend within a common module plane $P_3$ (FIG. 5). In the illustrated embodiment, each contact module 270 holds six differential pairs of signal contacts 252. However, the contact modules 270 may hold more or less than six differential pairs of signal contacts 252 in alternative embodiments. In other embodiments, the signal contacts 252 may be single ended rather than a part of differential pairs.

The header connector 222 also includes ground contacts 256 that are provided between pairs of signal contacts 252. The signal contacts 252 and the ground contacts 256 lie within the corresponding module plane $P_3$ and have an ordered arrangement of signal-signal-ground (S-S-G) (or an ordered arrangement of G-S-S). In some embodiments, each S-S-G group of contacts is terminated to a corresponding one cable 221 (FIG. 4). More specifically, the two conductors of each cable 221 are terminated to the signal contacts 252 and the drain wire of each cable 221 is terminated to the ground contact 256. The conductors and/or drain wires may be terminated directly to the respective signal or ground contacts 252, 256 through, for example soldering or welding, or the conductors and/or drain wires can be indirectly terminated to the respective signal or ground contacts 252, 256.

In an exemplary embodiment, the signal and ground contacts 252, 256 form part of the contact modules 270 and are terminated to corresponding conductors and drain wires of the cables 221. The signal contacts 252 and the ground contacts 256 are held by a contact module body 274 (shown in FIG. 6) to form the contact module 270. The contact module body 274 may be manufactured from a dielectric material, such as a plastic material, that is overmolded over a leadframe that includes the signal contacts 252 and the ground contacts 256. In an exemplary embodiment, during the overmolding process, ends of the cables 221 are overmolded within the contact module body 274 to secure the cables 221 to the contact modules 270. The drain wires of the cables 221 may be terminated (e.g., through soldering or welding) to the ground contacts 256 and the conductors of the cables 221 may be terminated to the signal contacts 252 prior to the overmolding process.

Alternatively, the contact module body 274 may include two or more body shells having cavities configured to receive the signal contacts 252 and the ground contacts 256. The signal and ground contacts 252, 256 may be placed within the cavities and terminated to the conductors and drain wires. The body shells may then couple together to form the contact module body 274 and the contact module 270. Regardless of the manufacturing process, after the contact modules 270 are formed or constructed, the contact modules 270 may be inserted through a rear opening of the connector housing 232. The contact modules 270 may, for example, form a frictional engagement with the connector housing 232 thereby securing the contact modules 270 therein.

Also shown in FIGS. 4 and 5, the connector housing 232 includes alignment features 276 for aligning the header connector 222 with the module connector 216 (FIG. 3) during a mating operation. In the illustrated embodiment, the alignment features 276 constitute slots formed in the sides of the connector housing 232 that receive projections during a mating operation. However, the slots are just one example and other types of structural features may be used in alternative embodiments to facilitate aligning the header connector 222.

As shown in FIGS. 6 and 7, the header connector 224 includes the connector housing 242 and a plurality of contact modules 278 (FIG. 6) held by the connector housing 242. Each contact module 278 includes a plurality of the signal contacts 254. The connector housing 242 includes a receiving space 280 along the mating side 244. The signal contacts 254 extend into the receiving space 280 and are configured to be mated with corresponding mating contacts (not shown). The signal contacts 254 are arranged in pairs and are configured to carry differential pair signals. The signal contacts 254 within each differential pair are held within a common contact module 278.

In some embodiments, the signal contacts 254 of each contact module 278 extend within a common module plane $P_4$ (FIG. 7). In particular embodiments, when the module connectors 216 (FIG. 3), 218 are orthogonal with respect to each other, the module planes $P_3$ (FIG. 5) of the header connector 222 (FIG. 3) and the module planes $P_4$ of the header connector 224 extend substantially parallel to one another.

Also shown, the header connector 224 includes ground shields 258 that at least partially surround a corresponding pair of signal contacts 254. In the illustrated embodiment, the ground shields 258 generally form an open-sided box that partially surrounds a corresponding pair of signal contacts 254. Each ground shield 258 is configured to shield the corresponding pair of signal contacts 254 from adjacent pairs of signal contacts 254. In an exemplary embodiment, the ground shields 258 form part of the contact modules 278 and may be terminated to drain wires within the cables 221 (FIG. 6). In an exemplary embodiment, the signal contacts 254 and/or the ground shields 258 are held by a contact module body 282 (FIG. 6) to form the contact module 278. The module body 282 may be manufactured using similar processes as described above for manufacturing the module body 274. In alternative embodiments, the header connector 224 may be identical to the header connector 222 (FIG. 3).

The connector housing 242 includes alignment features 284 for aligning the header connector 224 with the module connector 218 during a mating operation. In the illustrated embodiment, the alignment features 284 constitute projections formed along sidewalls of the connector housing 242 that are configured to be received by slots of the module connector 218. However, other types of alignment features 284 may be used in alternative embodiments to align the header connector 224 with the module connector 218 during mating.

Figure 8:
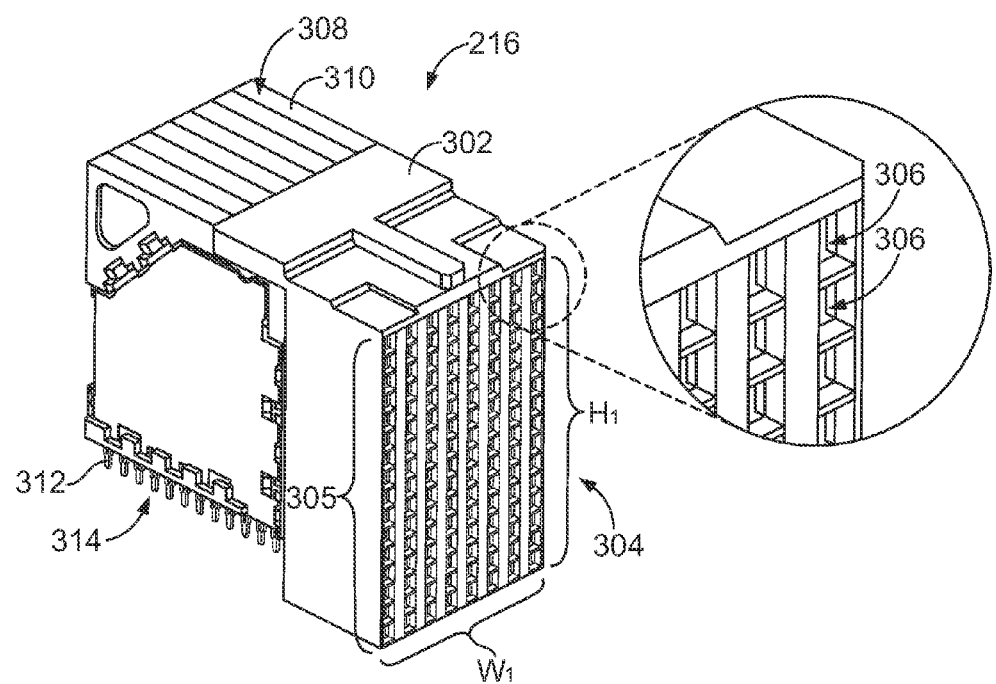
FIG. 8 is a perspective view of a module connector that may be used with a first card module of the communication system.
Figure 9:
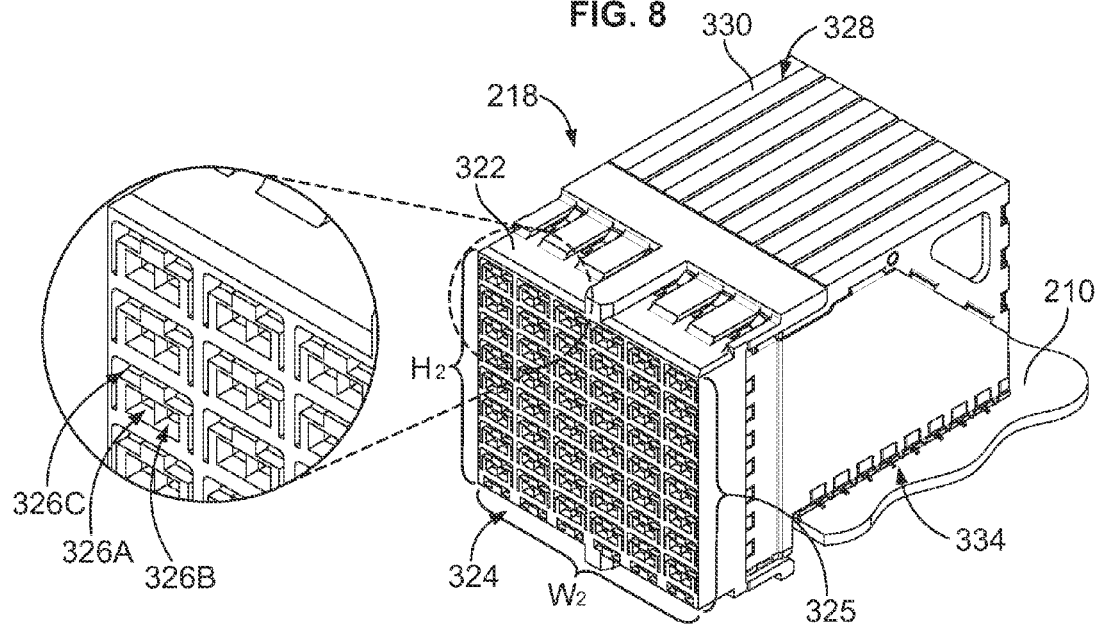
FIG. 9 is a perspective view of a module connector that may be used with a second card module of the communication system.

FIGS. 8 and 9 are perspective views of the module connectors 216, 218, respectively, which may be used as the module connectors 128, 132 described above with reference to FIGS. 1 and 2. However, the following description of the module connectors 216, 218 is not intended to be limiting as other types of connectors can be used. As shown in FIG. 8, the module connector 216 includes a connector housing or shroud 302 having a mating side 304. The mating side 304 includes an array of socket cavities 306. Each of the socket cavities 306 has a corresponding mating contact located therein (not shown) that is configured to engage one of the signal or ground contacts 252, 256 (FIG. 4).

The module connector 216 may be constructed from a plurality of contact modules 308 that are coupled to the connector housing 302. Each of the contact modules 308 includes a module body 310 having a plurality of conductors (not shown) therein. Each of the conductors extends from a mounting tail 312 to a corresponding contact located within one of the socket cavities 306. The mounting tails 312 extend along a mounting side 314 of the module connector 216 that is configured to be mounted to the circuit board 208 (FIG. 3). The connector housing 302 may have various structural features that facilitate aligning the module connector 216 and the header connector 222 (FIG. 3) during a mating operation.

As shown in FIG. 9, the module connector 218 includes a connector housing or shroud 322 having a mating side 324. The mating side 324 includes an array of socket cavities 326A-326C. Each of the socket cavities 326A-326B has a corresponding contact (not shown) located therein that is configured to engage one of the signal contacts 254 (FIG. 6). Each of the socket cavities 326C has a corresponding ground contact (not shown) that is configured to engage one of the ground shields 258 (FIG. 6). The module connector 218 may be constructed from a plurality of contact modules 328. Each of the contact modules 328 includes a module body 330 having a plurality of conductors (not shown) therein. Each of the conductors extends from a mounting tail (not shown) to a corresponding contact located within one of the socket cavities 326. The mounting tails extend along a mounting side 334 of the module connector 218 that is configured to be mounted to the circuit board 210. The connector housing 322 may also have various structural features that facilitate aligning the module connector 218 and the header connector 224 during a mating operation.

In an exemplary embodiment, the module connectors 216, 218 are different types of connectors. In particular, the module connectors 216, 218 may have different mating interfaces 305 (FIG. 8), 325 (FIG. 9) as described above. For example, the mating interfaces 305, 325 may have signal contacts or pairs of signal contacts that are differently sized or shaped. The signal/ground contacts of the mating interfaces 305, 325 can also be arranged differently. In addition, sizes of the mating interfaces 305, 325 can also be different. As shown in FIGS. 8 and 9, the module connector 216 has a height $H_1$ and width $W_1$, and the module connector 218 has a height $H_2$ and a width $W_2$. A height-width ratio for the module connector 216 is greater than a height-width ratio of the module connector 218. The heights $H_1$, $H_2$ may be different and the widths $W_1$, $W_2$ may also be different.

Figure 10:
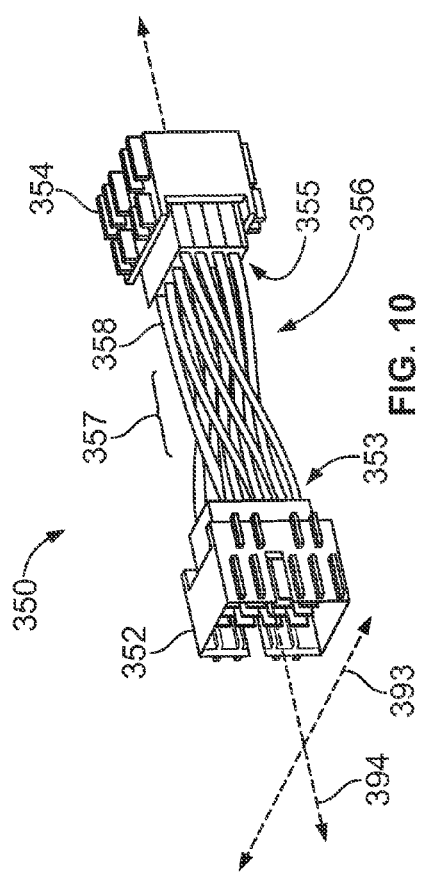
FIG. 10 is a perspective view of a cable assembly having a twisted cable bundle.

FIGS. 10-14 demonstrate the twist-free state or condition that the cable bundles and cables described herein may have. By way of comparison, FIG. 10 illustrates a cable assembly 350 that has cables 358 in twisted conditions. The cable assembly 350 has header connectors 352, 354 and a cable bundle 356 of the cables 358 extending therebetween. The header connectors 352, 354 have respective loading sides 353, 355 and the cables 358 extend between the loading sides 353, 355 to communicatively couple the header connectors 352, 354.

In FIG. 10, the cable assembly 350 has been oriented with respect to an axial line 394 and a lateral axis 393. The header connectors 352, 354 are identical and have been rotated about 90° relative to each other with respect to the axial line 394. The cable bundle 356 and the cables 358 have been twisted 90° about the axial line 394 between the loading side 353 and the loading side 355. As shown in FIG. 10, when the cables 358 are in a twisted state or condition, the cables 358 cross over each other near a center portion 357 of the cable bundle 356. The center portion 357 may represent a middle ⅓ of the cable bundle 356.

Figure 11:
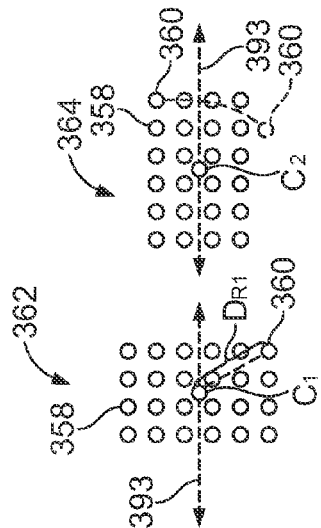
FIG. 11 illustrates different arrangements of communication cables of the cable assembly of FIG. 10 before and after the cables have been twisted.

FIG. 11 illustrates an arrangement 362 of the cables 358 when the cables 358 are terminated to the loading side 353 (FIG. 10) and an arrangement 364 when the cables 358 are terminated to the loading side 355 (FIG. 10). The view in FIG. 11 is along the axial line 394 from one end of the cable bundle 356 that is attached to the loading side 353 to the other end of the cable bundle 356 that is attached to the loading side 355. For example, the view may be from the intersection of the axial line 394 and the lateral axis 393 with the header connectors 352, 354 removed. For reference, geometric centers $C_1$ and $C_2$ of the loading sides 353, 355, respectively, are shown in the arrangements 362, 364. The axial line 394 (FIG. 10) can extend approximately through the centers $C_1$ and $C_2$.

When one or both of the header connectors 352, 354 (FIG. 10) are rotated about the axial line 394, the cables 358 are twisted about the axial line 394 between the loading sides 353, 355. By way of example, the arrangement 364 shows a representative cable 360 twisted about 90° from the loading side 353 to the loading side 355. The arrangement 364 shows a location of the cable 360 before the cable 360 is twisted about the axial line 394 (indicated in dashed lines) and a location of the cable 360 after rotation (indicated in solid lines). Because the header connectors 352, 354 are identical, the representative cable 360 is essentially the same distance $D_{R1}$ from the corresponding center C in either of the arrangements 362, 364.

When viewed along the axial line 394 and with the lateral axis 393 as the horizon, the cables 358 have a first order in the arrangement 362 and a different second order in the arrangement 364. More specifically, each of the cables 358 may have an address (e.g., row number, column number) in the arrangement 362. After the twisting operation, the cables 358 have different addresses in the arrangement 364. For example, the cable 360 is located at a bottom right-hand corner of the arrangement 362 when viewed along the axial line 394 with the lateral axis 393 as the horizon. However, after twisting the cables 358, the cable 360 is located at a top right-hand corner of the arrangement 364 when viewed along the axial line 394 with the lateral axis 393 as the horizon. Accordingly, twisting the cables 358 effectively changes the order of the cables 358. As will be described in greater detail, some embodiments described can maintain the order of the cables.

Figure 13:
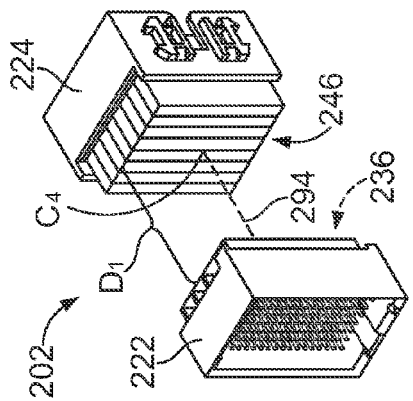
FIG. 13 is a top view of the cable bundle showing the cables in twist-free conditions.
Figure 12:
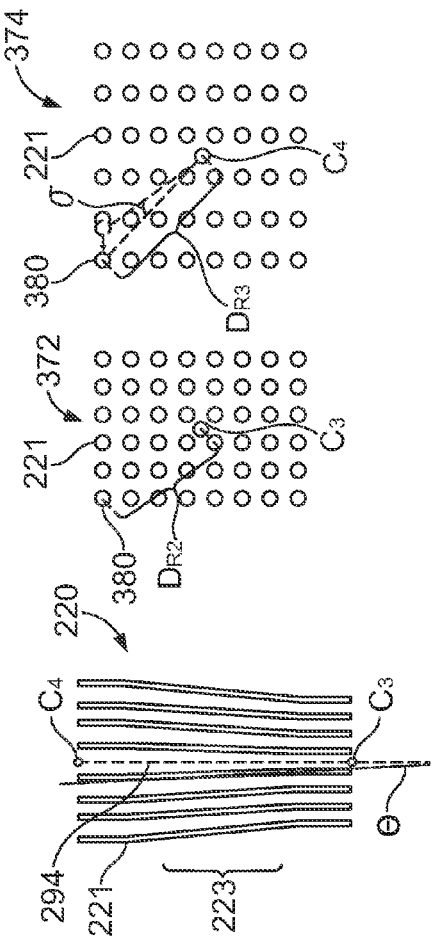
FIG. 12 illustrates the cable assembly of FIG. 3 without a cable bundle.

FIG. 12 shows the cable assembly 202 with the cable bundle 220 (FIG. 3) removed. The axial line 294 has been drawn between a geometric center $C_3$ (shown FIGS. 13 and 14) of the loading side 236 and a geometric center $C_4$ of the loading side 246. The header connectors 222, 224 are separated by a distance $D_1$. FIG. 13 shows a top view of the cable bundle 220, and FIG. 14 illustrates an arrangement 372 of the cables 221 at the loading side 236 (FIG. 3) and an arrangement 374 of the cables 221 at the loading side 246 (FIG. 3).

With reference to FIG. 13, in some embodiments, the cables 221 are configured to be substantially twist-free as the cables 221 extend between the header connectors 222, 224 (FIG. 3). As shown, the cables 221 do not cross over each other as the cables 221 extend between the loading sides 236, 246 (FIGS. 3 and 12). For example, when viewed along either the orientation axis 292 (FIG. 3) or the lateral axis 293 (FIG. 3), the cables 221 do not cross over each other.

In a substantially twist-free condition, the cables 221 can extend generally parallel to the axial line 294 that extends between the centers $C_3$, $C_4$. As used herein, the term "generally parallel" includes the cables 221 extending parallel to the axial line 294 or jogging slightly away or toward the axial line 294. The cables 221 may extend slightly away or toward the axial line 294 to account for the different sizes of the loading sides 236, 246 (FIG. 12) or to account for movement of the header connectors 222, 224. As shown in FIG. 13, the cables 221 may move away from the axial line 294 along a center portion 223 of the cable bundle 220 as the cables 221 extend from the loading side 236 to the loading side 246. The center portion 223 may represent a middle ⅓ of a length of the cable bundle 220. More specifically, the cables 221 may move away at a small angle θ. The angle θ can be less than or about equal to 20° or less than or about equal to 15°. In particular embodiments, the angle θ does not exceed about 10° or, more particularly, does not exceed about 5°.

Figure 14:
FIG. 14 illustrates different arrangements of communication cables of the cable assembly of FIG. 3.

With reference to FIG. 14, in some embodiments, the cables 221 may not change in order as the cables 221 extend between the loading sides 236, 246 (FIGS. 3 and 12). The cables 221 may have the same address in the first and second arrangements 372, 374. By way of one example, a representative cable 380 is in the top left-hand corner in the arrangement 372 and also in the top left-hand corner in the arrangement 374. The address of the cable 380 did not change.

Cables may be substantially twist-free even if negligible amounts of twisting occur about the axial line. As shown in the arrangement 374, a phantom representation of the cable 380 indicates the location of the cable 380 along the loading side 236 before the cable 380 transitions to the loading side 246. As the cable 380 extends from the loading side 236 to the loading side 246, the cable 380 extends slightly away from the axial line 294 (FIG. 3). Due to this jogging, a total twist of the representative cable 380 relative to the axial line 294 is only a negligible angle σ. The angle σ may be less than about 10° with respect to the axial line 294 or, more particularly, less than about 5°.

As another example, when the cables 221 are substantially twist-free, the cables 221 may maintain a relative radial distance $D_R$ from the axial line 294 or the cables 221 may move slightly closer to or away from the axial line 294. For example, the cable 380 in FIG. 14 is located at a radial distance $D_{R2}$ away from the center $C_3$ in the arrangement 372 and at a radial distance $D_{R3}$ from the center $C_4$ in the arrangement 374. When the cables 221 are substantially twist-free, the distances $D_{R2}$ or $D_{R3}$ may be about equal or one of the distances $D_{R2}$ or $D_{R3}$ may be slightly greater than the other. For example, the difference between the two distances $D_{R2}$ or $D_{R3}$ may be less than 30% of the greater of the distances $D_{R2}$ or $D_{R3}$. More particularly, the difference may be less than 20% or 10% of the greater of the distances $D_{R2}$ or $D_{R3}$.

In some embodiments, the cable bundle 220 does not permit the header connector 222 to be twisted 90° or greater about the axial line 294 without damaging at least one of the cables 221, the header connector 222, or the header connector 224. For example, when the cables 221 are substantially twist-free, lengths of the cables 221 may be relatively short such that twisting the header connectors 222, 224 relative to each other 90° or greater would require damaging at least one of the cables 221, the header connector 222, or the header connector 224. The damage could be through breaking at least one of the terminations between the cables 221 and the header connectors 222, 224 thereby rendering one or more of the cables 221 unsuitable for its intended purpose.

In cable assemblies that have twisted cables, it may be necessary to have a minimum separation distance between the header connectors to permit the twisted configuration. More specifically, the stiffness of the individual cables may require the header connectors to be separated by the minimum separation distance to achieve the twisted configuration. However, the substantially twist-free embodiments described herein may permit shorter lengths of the cables. In such embodiments, the cable assembly 202 allows configurations of the communication system 100 (FIG. 1) where the gap 123 (FIG. 2) can be shorter. By reducing the size of the gap 123, the size of the communication system 100 may also be reduced.

The above description has provided various qualities that can exist when a cable assembly 202 is substantially twist-free. However, it may not be necessary for each and every quality to exist for the cable bundle 220 or the cables 221 to be substantially twist-free. For example, the difference between the two distances $D_{R2}$ or $D_{R3}$ could be greater than 30% of the greater of the two distances $D_{R2}$ or $D_{R3}$, but the cables 221 could still not cross-over each other. Likewise, the angle σ could be greater than 10°, but the cables 221 could still not cross-over each other.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. A cable assembly comprising:
    a first header connector having mating and loading sides and including electrical contacts, the mating side configured to mate with a first module connector;
    a second header connector having mating and loading sides and including electrical contacts, the mating side of the second header connector configured to mate with a second module connector; and
    a cable bundle including communication cables that extend between the loading sides of the first and second header connectors and that connect the electrical contacts of the first and second header connectors, wherein the cables are substantially twist-free between the first and second header connectors when the first and second header connectors face in substantially opposite directions and when the first and second module connectors have an orthogonal relationship, and wherein the electrical contacts of the first header connector are at least one of shaped differently or spaced apart differently than the electrical contacts of the second header connector.

2. The cable assembly of claim 1, wherein the cables are generally parallel to an axial line that extends between respective geometric centers of the loading sides of the first and second header connectors when the first and second header connectors face in substantially opposite directions, the cables having lengths that do not permit the first header connector to be relatively rotated 90° about the axial line without damaging at least one of the cables, the first header connector, or the second header connector.

3. The cable assembly of claim 2, wherein:
    the first header connector includes contact modules that have the electrical contacts of the first header connector, the electrical contacts of each contact module extending within a corresponding module plane; and the second header connector includes contact modules that have the electrical contacts of the second header connector, the electrical contacts of each contact module of the second header connector extending within a corresponding module plane, wherein the corresponding module planes of the first header connector and the corresponding module planes of the second header connector extend substantially parallel to one another when the loading sides oppose each other and the cables extend generally parallel to an axial line.

4. The cable assembly of claim 1, wherein the first and second header connectors include first and second mating interfaces, respectively, that are configured to directly engage the first and second module connectors, respectively, the first mating interface including the electrical contacts of the first header connector and the second mating interface including the electrical contacts of the second header connector, wherein the electrical contacts at the first mating interface are at least one of shaped differently or spaced apart differently than the electrical contacts at the second mating interface.

5. The cable assembly of claim 1, wherein the first and second header connectors have respective heights that are measured along a first axis when the mating sides face away from each other in opposite directions and the cables extend generally parallel to one another, the first and second header connectors having respective widths that are measured along a second axis when the mating sides face away from each other in opposite directions and the cables extend generally parallel to one another, the first and second axes being perpendicular to each other, wherein at least one of the heights are different or the widths are different.

6. A cable assembly comprising:
a first header connector comprising electrical contacts and including mating and loading sides, the mating side configured to mate with a first module connector;
a second header connector comprising electrical contacts and including mating and loading sides, the mating side of the second header connector configured to mate with a second module connector; and
a cable bundle having communication cables that extend between the loading sides of the first and second header connectors and connect the electrical contacts of the first and second header connectors, wherein the cables extend generally parallel to an axial line that extends between respective geometric centers of the loading sides of the first and second header connectors, wherein the cables have lengths that do not permit the first header connector to be rotated 90° about the axial line when the mating sides face in substantially opposite directions without damaging at least one of the cables, the first header connector, or the second header connector.

7. The cable assembly of claim 6, wherein the cables have relative locations with respect to one another, the relative locations being substantially the same at the loading side of the first header connector and at the loading side of the second header connector when the cables extend generally parallel to the axial line.

8. The cable assembly of claim 6, wherein the electrical contacts of the first header connector are at least one of shaped differently or spaced apart differently than the electrical contacts of the second header connector.

9. The cable assembly of claim 6, wherein the cables of said bundle have substantially equal lengths.

10. The cable assembly of claim 6, wherein:
the first header connector includes contact modules that have the electrical contacts of the first header connector, the electrical contacts of each contact module extending within a corresponding module plane; and
the second header connector includes contact modules that have the electrical contacts of the second header connector, the electrical contacts of each contact module of the second header connector extending within a corresponding module plane, wherein the corresponding module planes of the first header connector and the corresponding module planes of the second header connector extend substantially parallel to one another when the cables extend generally parallel to the axial line.

11. A communication system comprising:
a system chassis;
a front card module having a circuit board and a module connector mounted to the circuit board;
a rear card module having a circuit board and a module connector mounted to the circuit board, the front and rear card modules are configured to be held by the system chassis so that the module connector of the front card module substantially opposes the module connector of the rear card module with a gap between the module connectors; and
a cable assembly positioned in the gap and comprising first and second header connectors, the first header connector configured to mate with the module connector of the front card module and the second header connector configured to mate with the module connector of the rear card module, the cable assembly also including a cable bundle having communication cables that extend between and connect the first and second header connectors;
wherein the cables extend across the gap in a substantially twist-free manner when the first and second header connectors are mated to the corresponding module connectors and the circuit boards of the front and rear card modules have an orthogonal relationship relative to each other.

12. The communication system of claim 11, wherein the first and second header connectors include respective loading sides, the cables extending generally parallel to an axial line that extends between respective geometric centers of the loading sides when the front and rear card modules have the orthogonal relationship.

13. The communication system of claim 12, wherein the cables have lengths that do not permit the first header connector to be rotated 90° about the axial line without damaging at least one of the cables, the first header connector, or the second header connector.

14. The communication system of claim 11, wherein:
the first header connector includes contact modules that have the electrical contacts of the first header connector, the electrical contacts of each contact module extending within a corresponding module plane; and
the second header connector includes contact modules that have the electrical contacts of the second header connector, the electrical contacts of each contact module of the second header connector extending within a corresponding module plane, wherein the corresponding module planes of the first header connector and the corresponding module planes of the second header connector extend substantially parallel to one another when the front and rear card modules have the orthogonal relationship.

15. The communication system of claim 11, wherein the module connector of the first card module and the module connector of the second card module have different mating interfaces.

16. The communication system of claim 11, wherein the cables permit the first and second header connectors to float with respect to the system chassis.

17. The communication system of claim 11, wherein the first and second header connectors have first and second loading sides, respectively, with corresponding geometric centers, the first and second loading sides opposing each other with the cables extending therebetween, wherein the cable assembly has an axial line extending between the corresponding geometric centers, each of the cables having a total twist from the first loading side to the second loading side that is at most 10° with respect to the axial line.

18. The communication system of claim 11, wherein the first and second header connectors have loading sides that oppose each other with the cables extending therebetween, each of the cables having a first location at the loading side of the first header connector relative to a geometric center of the loading side of the first header connector, each of the cables having a second location at the loading side of the second header connector relative to a geometric center of the loading side of the second header connector, wherein the first and second locations are first and second radial distances away from the corresponding geometric center, wherein a difference between the first and second radial distances is at most 30% of the greater of the first and second radial distances.

19. The communication system of claim 11, wherein the first and second header connectors have loading sides that oppose each other, the cables extending between the loading sides and having respective addresses at the loading side of the first header connector and the loading side of the second header connector, each address representing a spatial location of the corresponding cable relative to spatial locations of other cables at the corresponding loading side, wherein the address for each corresponding cable at the loading side of the first header connector is the same as the address for the corresponding cable at the loading side of the second header connector.

20. The communication system of claim 19, wherein each of the addresses is represented by a row number and a column number along the corresponding loading side.

* * * * *